United States Patent [19]
Onda et al.

[11] Patent Number: 5,172,469
[45] Date of Patent: Dec. 22, 1992

[54] ADVANCED PART REMOVAL AND TORQUE SHEAR STATION

[75] Inventors: Edward J. Onda, Hermosa Beach; Craig S. Iwami, Dana Point, both of Calif.

[73] Assignee: Hughes Aircraft Company, Los Angeles, Calif.

[21] Appl. No.: 698,747

[22] Filed: May 8, 1991

[51] Int. Cl.$^5$ ............................................. H05K 13/04
[52] U.S. Cl. .................................... 29/762; 29/709; 29/714
[58] Field of Search ................... 29/402.03, 426.4, 709, 29/714, 762, 739, 740, 741, DIG. 21, DIG. 24; 156/344

[56] References Cited

U.S. PATENT DOCUMENTS 4,790,069 12/1988 Maruyama et al. ............... 29/714 X
4,828,162 5/1989 Donner et al. .................... 29/762 X

FOREIGN PATENT DOCUMENTS 2512623 3/1975 Fed. Rep. of Germany ........ 29/762
6459 1/1981 Japan ..................................... 29/762
286387 11/1989 Japan ..................................... 29/762
18990 1/1990 Japan ..................................... 29/762

OTHER PUBLICATIONS

"A Review of Repairable Die Attach for CuPI MCM", by Thom A. Bishop, pp. 77–89.

Primary Examiner—Timothy V. Eley
Attorney, Agent, or Firm—Terje Gudmestad; W. K. Denson-Low

[57] ABSTRACT

Workstation apparatus for automatically and vertically removing defective devices from delicate high density multilayer interconnect substrates, and for removing devices and substrates from large area substrates without damaging the substrates or closely-spaced neighboring devices on the substrates. The apparatus is also usable to precisely measure semiconductor attach shear strength by applying a torsional force and identifying the arc angle to failure. A table assembly positions and secures a substrate comprising a device to be removed. A thermode is adhered to the device to be removed with a high temperature thermosetting adhesive. A heater stage in the table assembly preheats the substrate including the device to be removed. The thermode has a strip heater, a thermocouple and a passage for a cooling fluid. The thermode temperature is adjustable for curing the adhesive and for loosening the device from the substrate. The device is removed by applying torque and vertical tensile loading at the same time. When the device breaks loose from the substrate, torque is no longer applied. A control electronics and central processing unit precisely controls the operation. A torque transducer and a pressure and tensile loading transducer are mechanically connected to the thermode and electrically coupled to the control electronics and central processing unit to provide for feedback and control of the removal process. A method of removing devices is also disclosed.

15 Claims, 4 Drawing Sheets

ADVANCED PART REMOVAL AND TORQUE SHEAR STATION

BACKGROUND

The present invention relates generally to integrated circuit part removal apparatus and methods, and more particularly to die removal apparatus and for use with semiconductor integrated circuit chips and components that are attached to high density multichip interconnect hybrid packages, and for removal of large area substrates from packages.

Spacings between integrated circuits are commonly between 0.100 and 0.250 of an inch, and high density multichip interconnect technology has reduced device spacing to a point that reworking of hybrids is now more difficult than ever. Spacing of high density multichip interconnect technology devices has decreased by as much as a factor of ten in the last few years. This has caused the abandonment of conventional rework techniques.

Conventional removal methods for use in removing large area devices, and removing closely spaced devices attached to substrates employ a well known "hot-shot" technique. This technique requires heat to be applied to the bottom of the substrate of the hybrid package, while applying a stream of hot inert gas onto the surface of the device to be removed. Then the device is peeled away from the substrate using a wedge shaped instrument. On delicate thin film multilayer substrates, large area devices, or closely spaced devices, this process is not feasible. Moreover, this technique is neither accurate nor repeatable.

Equipment has been developed that vertically removes devices from substrates by applying pure tensile force to a device. However, delicate high density multichip interconnect substrates are not able to survive this type of force alone. Also, no known equipment exists which is able to torsionally test flip-chip die attach shear strengths.

The transactions of the 1990 International Electronics Packaging Society (IEPS) includes a technical paper that surveys the field of removal of integrated circuits from multi-chip modules. The paper discusses die shear, dual blade twist off, tensile die pull, and hot gas/-tweezer techniques of die removal. The paper appears at pages 77–89, and is entitled "A Review of Repairable Die Attach For CuPi MCM". The author is Thom A. Bishop of Microelectronics and Computer Technology Corp. (MCC), Austin, Tex. 78727.

Furthermore, there are times when it is necessary to remove a substrate from a package. These substrates are typically soldered or adhered to the large area substrates using adhesive epoxy or thermoplastic material and it has heretofore been difficult, if not impossible, to remove defective ones without destroying the complete substrate.

Accordingly, it would be desirable to provide for equipment that is capable of removing devices from high density multichip interconnect substrates, and remove substrates from a package without damage to other devices or substrates. It would also be desirable to provide for equipment that is able to torsionally test flip-chip die attach shear strengths.

SUMMARY OF THE INVENTION

In order to overcome the limitations of conventional die removal equipment, the present invention comprises a die removal, substrate removal, and torque shear test station that is adapted to remove damaged devices vertically from a hybrid microcircuit without interfering with close proximity neighboring devices, and remove small substrates or packages from large area substrates or large multichip packages. A device or substrate is vertically removed by simultaneously applying tensil and torsional forces to the device. All forces are measured and controlled in real time. The equipment also provides for evaluation of flip chip solder bump die attach strength. Shear testing is accomplished by applying torque to the test specimen while simultaneously measuring the arc angle until failure occurs.

By using the present invention to transfer some of the tensile force torsionally, high density multichip interconnect substrates survive the rework process without damage. The present invention is able to shear test flip chip solder bump die attach by applying a torsional force, and identifying the arc angle at which failure occurs. All data is then stored in a database for quantitative, and qualitative analysis.

The present invention allows an operator to remove devices from the delicate high density multichip interconnect substrates, without fear of damaging materials, or neighboring devices. Without the equipment of the present invention, rework time is increased, and losses due to rework are also increased. Furthermore, the use of flip-chip attach technology requires a method of determining the reliability of the flip-chip die attach method. The present invention is able to accomplish this task simply, and accurately.

The present invention employs techniques which allow for accurate and repeatable removal of closely spaced integrated circuits. Removal of an integrated circuit is accomplished by attaching a special tool directly to the device or substrate using a thermoset, or a thermoplastic die attach material. All compressive forces and temperatures placed upon the device or substrate during attachment are controlled in real time. Once the tool has been attached, tensile and torsional forces are applied to the device or substrate simultaneously. These forces may also be applied singularly, simultaneously, or incrementally using a central processing unit and associated software to control force application. At the instant that device removal occurs, all torsional forces cease, thus avoiding damage to neighboring devices by the rotation of the removed device.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
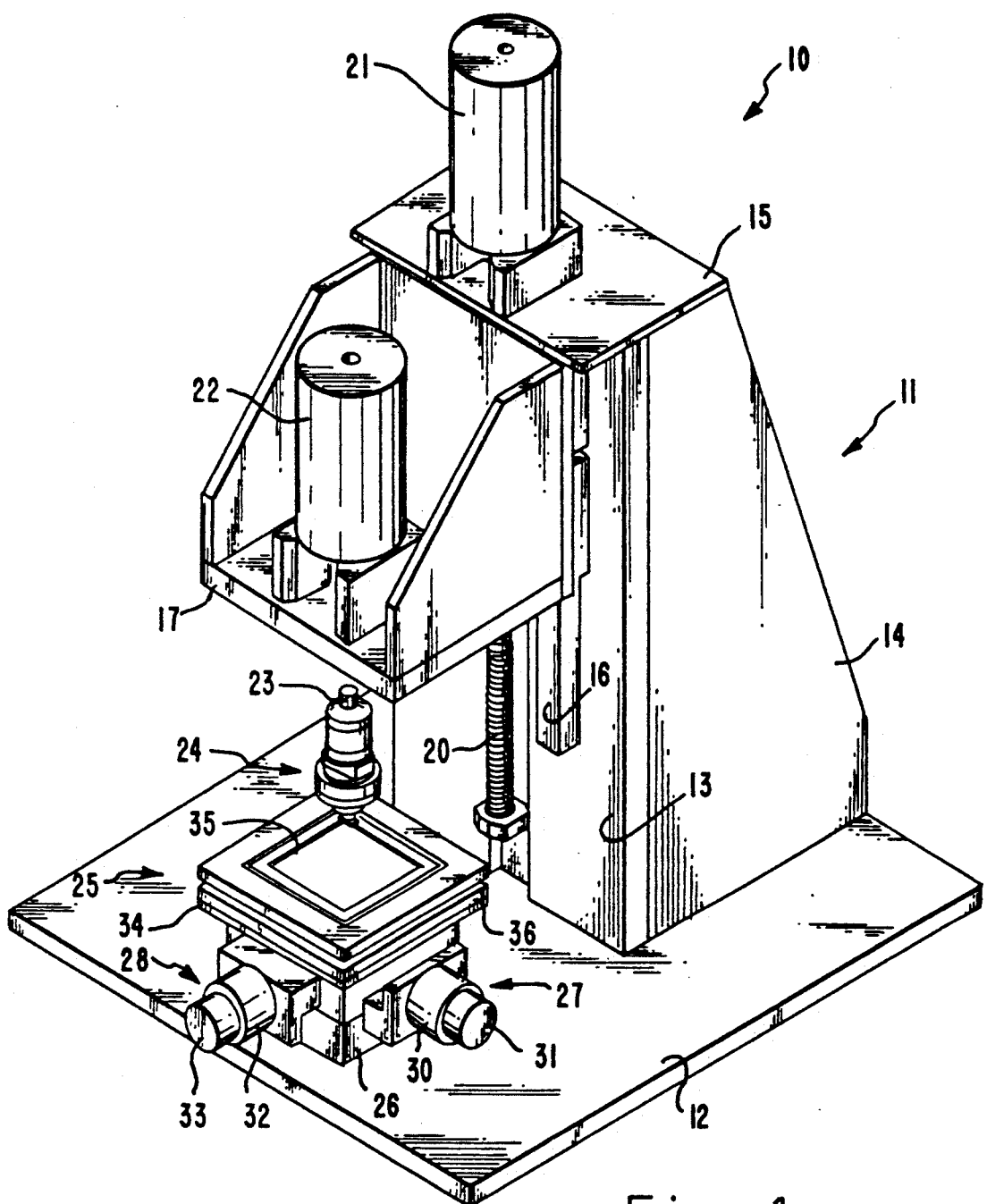
FIG. 1 is a perspective view of a die removal workstation constructed in accordance with the principles of the present invention.

Referring now to the drawings, FIG. 1 is a perspective view, partly in phantom, of an exemplary embodiment of a die removal workstation 10 constructed in accordance with the invention. The workstation 10 comprises a support structure 11 including a flat horizontal base plate 12 having an orthogonal upright member 13 mounted thereto. Buttresses 14 are fastened to the side of the upright member 13 to maintain the rigidity of the support structure 11. A thin, rectangular cover 15 is fastened to the top of the upright member 13 and to the top of the buttresses 14. The support structure 11 may be assembled using machine screws, welding or any other conventional technique.

Linear guide rails 16 are fastened to the upright member 13 to guide a movable platform assembly 17. The platform assembly 17 is fastened to the guide rails 16 and is adapted for precision movement in the vertical or z-axis direction. A jack screw 20 is mounted to the upright member 13 between the guide rails 16. The platform assembly 17 comprises a nut member that engages the threads of the jack screw 20 so that rotation of the jack screw 20 causes linear vertical movement of the platform assembly 17.

A fist stepper motor 21 is disposed on the cover 15 at the top of the upright member 13. The first stepper motor 21 is coupled to the jack screw 20 for rotation thereof. The first stepper motor 21 comprises a first shaft encoder for use in providing precision control of the rotation of the jack screw 20. A second stepper motor 22 is disposed on the platform assembly 17 and is adapted to rotate a shaft 23 that is fastened to a carriage assembly 24. The shaft 23 is aligned vertically. The second stepper motor 22 comprises a second shaft encoder for use in providing precision control of the rotation of the shaft 23. The first and second stepper motors 21, 22 may be of any suitable make or manufacture. A model that has been found satisfactory is the GMA series gearmotors manufactured by Empire Magnetics, Inc., Rohnert Park, Calif. The particular model used in an exemplary embodiment of the die removal work station 10 of the present invention is model GMA33:10-E. This model has a 1000 line encoder mounted to the shaft of the motor.

A movable table assembly 25 is disposed on the horizontal base plate 12 below the carriage assembly 24. The table assembly 25 comprises a pedestal 26 having an x-axis assembly 27 and a y-axis assembly 28. The x-axis assembly 27 comprises an x-axis drive motor 30 and an x-axis manual control 31. The y-axis assembly 28 comprises a y-axis drive motor 32 and a y-axis manual control 33. The x-axis assembly 27 and the y-axis assembly 28 are connected to provide precision movement in the x and y directions to a table 34. The table 34 is provided with a mechanism to lock or clamp a semiconductor hybrid microcircuit 35 thereto. The table 34 is provided with a heater stage 36 for heating the bottom of the hybrid microcircuit 35. In the exemplary embodiment of the die removal workstation 10 of the present invention, the table assembly 25 was purchased from New England Affiliates, and includes x and y-axis drive motors 30, 32 made by Rapidsyn Division of American Precison, Oceanside, Calif.

Figure 2:
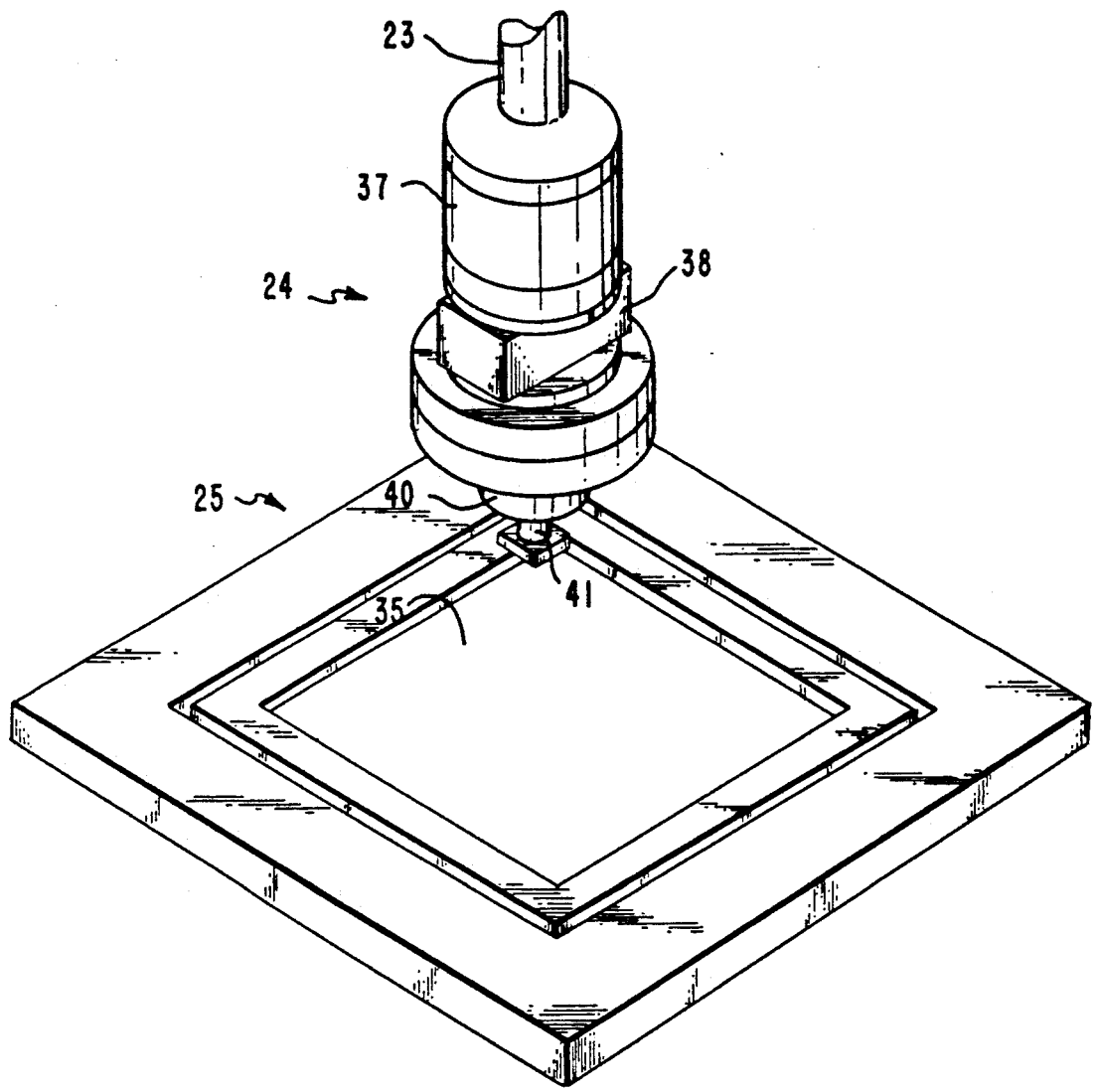
FIG. 2 is a perspective view of a carriage assembly used in the die removal work-station of FIG. 1.

Referring now to FIG. 2, the carriage assembly 24 and shaft 23 may be seen. The carriage assembly 24 comprises a torque transducer 37, a pressure and tensile loading transducer 38 and an insulated thermode carriage 40, all connected in tandem and aligned vertically. An exemplary embodiment of a thermode 41 is shown in FIG. 2 installed in the thermode carriage 40. The term "thermode" is used herein to identify a special pull stud or peg having a strip heater, a thermocouple and a cooling orifice. Typically, air or gaseous nitrogen is used for cooling, although any fluid medium may be used, including other gases, and in some cases, liquids. A typical embodiment of a thermode is described in detail in a related patent application assigned to the assignee of the present invention. The related application, Ser. No. 07/697,658, was filed May 8, 1991 for "Method and Apparatus For Removing Semiconductor Devices From High Density Multichip Modules," invented by Craig S. Iwami and Edward J. Onda. The transducers 37, 38 used in the exemplary embodiment of the die removal workstation 10 of the present invention were manufactured by Transducer Techniques, Temecula, Calif. The torque transducer 37 is a model TRT-500 torque sensor. The pressure and tensile loading transducer 38 is a model MLP-1K load cell.

Figure 3:
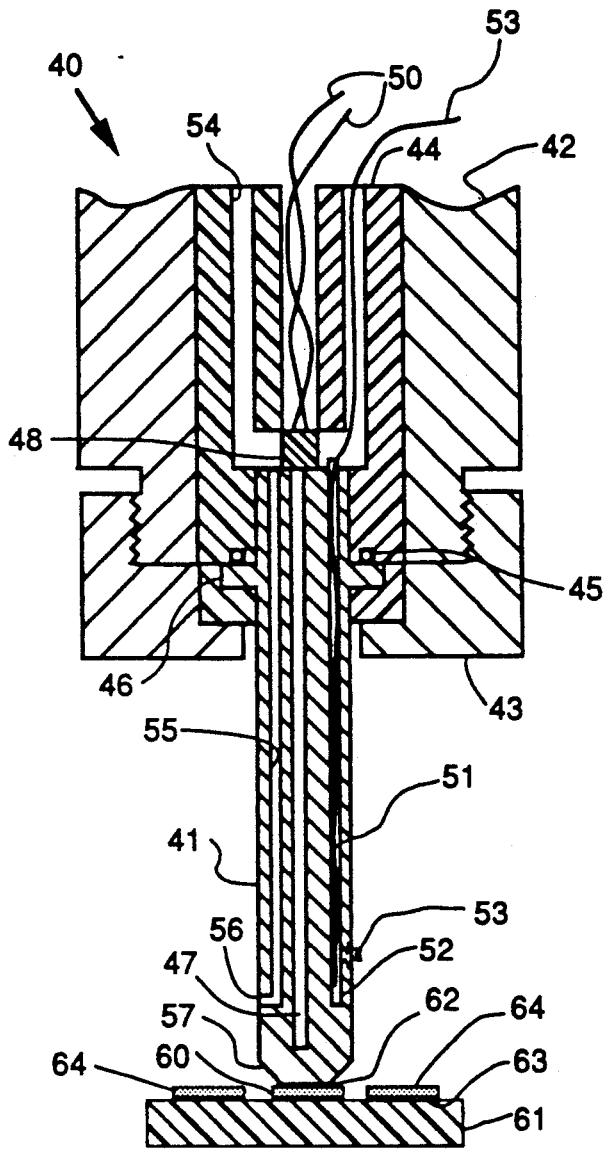
FIG. 3 is a cross-sectional side view of a thermode mounted in the die removal workstation of FIG. 1.

FIG. 3 shows a cross-sectional side view of the thermode 41 mounted in the thermode carriage 40. The thermode carriage 40 comprises a collar 42 having a retaining cap 43 that mounts thereto by screw threads. The thermode carriage 40 is provided with an internal thermal insulator 44 made of a material such as Torlon. The thermode 41 seats into an opening provided in the collar 42 and butts against an O-ring 45 that is retained in an annular groove. The retaining cap 43 seats against a retaining collar 46 provided on the thermode 41, and holds it in place. A strip heater 47 extends down the center of the thermode 41. The heater 47 plugs into a Torlon connector 48 having a pair of wires 50 extending therefrom to provide power to the heater 47. A thermocouple 51 extends down a hole 52 provided in the thermode 41, and has connecting wires 53 extending away therefrom. A set screw 53 is provided for holding the thermocouple 51 in the hole 52. An entrance orifice 54 is provided in the thermal insulator 44 above the thermode 41 to provide a passage for a cooling fluid such as air or nitrogen ($N_2$). The cooling fluid passes through a hole 55 provided in the thermode 41 and exists through an opening 56 near the bottom thereof.

The thermode 41 is provided with a chamfer or bevel 57 to adapt the size of the thermode 41 to the size of a defective semiconductor integrated circuit device 60 that is to be removed from a substrate 61. Alternatively, the device 60 may be an integrated circuit package or a small substrate secured to a larger substrate by solder, adhesive, or a tape automated bonding procedure; a device secured to a high density multichip interconnect (HDMI) substrate by solder or adhesive; a device secured to a low temperature cofired ceramic substrate by solder or adhesive; or a flip chip attached to a substrate by solder or a tape automated bonding procedure, for example. It is to be understood that the defective semiconductor integrated circuit device 60 is to be representative of any of these alternative embodiments for the purposes of this disclosure. It is also to be understood that the above-mentioned devices and substrates may be substituted for the defective semiconductor integrated circuit device 60 in the drawing figures.

Accordingly, and with regard to one specific procedure in accordance with the present invention, the thermode 41 is glued or otherwise adhered to the defective semiconductor integrated circuit device 60 using an adhesive 62 having a greater adhesion strength at elevated temperatures than an adhesive 63 used to attach the semiconductor integrated circuit device 60 to the substrate 61. One suitable adhesive is Ablestick number 41-1 thermosetting adhesive. Other semiconductor devices 64 closely spaced from the defective semiconductor integrated circuit device 60 are shown secured to the substrate 61 by an adhesive 63.

Figure 4:
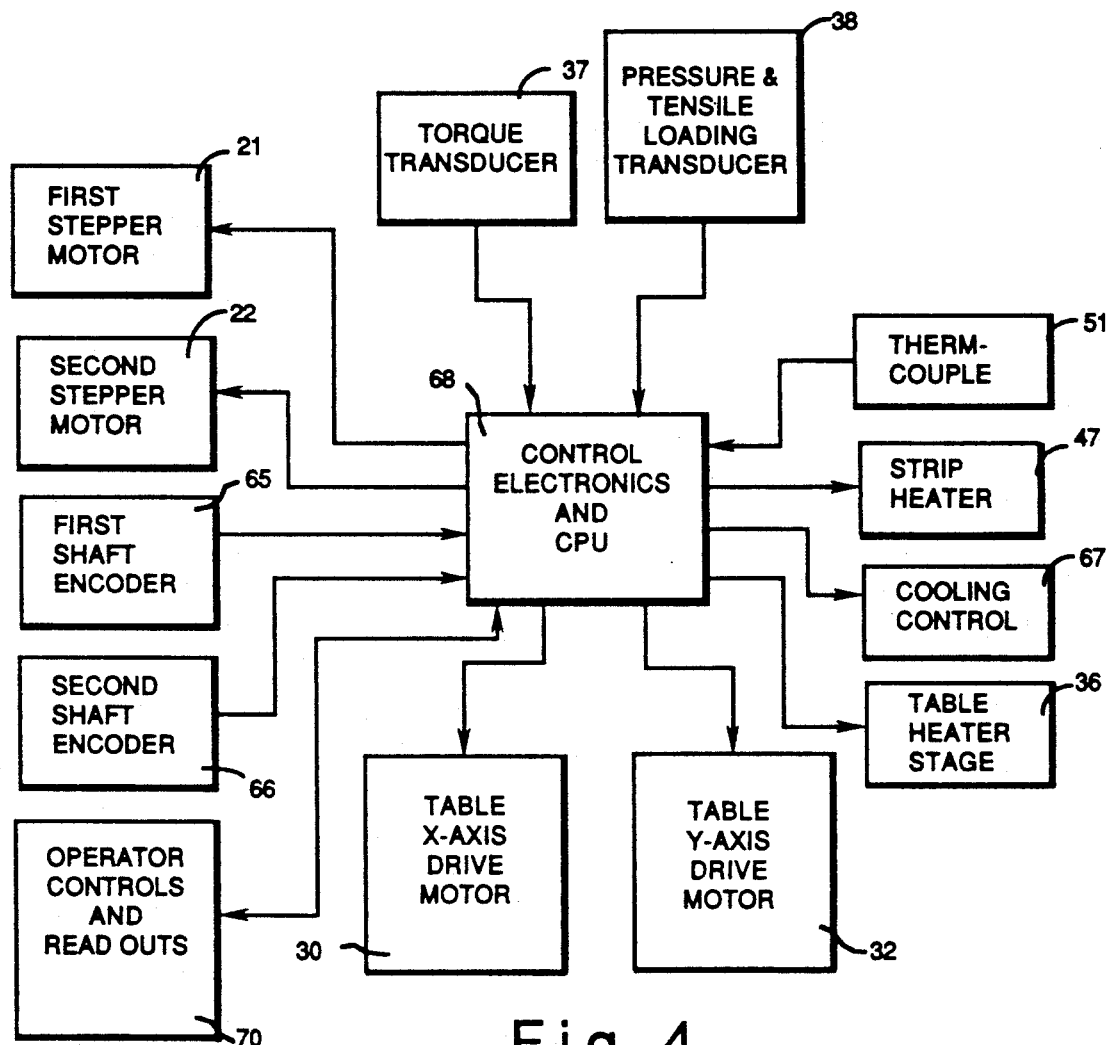
FIG. 4 is a schematic diagram in block form of the control electronics for the die removal workstation of FIG. 1.

FIG. 4 shows a block diagram of the control electronics assembly for use with the die removal workstation 10 of FIGS. 1 and 2. The control electronics assembly comprises a control electronics and central processing unit 68. This unit 68 contains power supplies, driver units, servo amplifier units and digital signal processor units necessary to operate the die removal workstation 10. The first stepper motor 21 is driven by a stepper motor driver unit located in the control electronics and central processing unit 68, and operates in an electronic feedback loop. A suitable stepper motor driver unit is manufactured by Compumotor Division of Parker Hannifin Corporation, Rohnert Park, Calif. The shaft position of the first stepper motor 21 is communicated to the control electronics and central processing unit 68 by the first shaft encoder 65. Similarly, the second stepper motor 22 operates in an electronic feedback loop and has its shaft position communicated to the control electronics and central processing unit 68 by the second shaft encoder 66. The amount of torque being applied to an integrated circuit device 60 by the thermode 41 is measured by the torque transducer 37, and the measurement is communicated to the control electronics and central processing unit 68. The torque measurement may be used to control movement of the thermode 41, or the measurement may be read out at an operator controls and read out unit 70.

Similarly, the amount of pressure and tensile loading being applied to an integrated circuit device 60 by the thermode 41 is measured by the pressure and tensile loading transducer 38, and the measurement is communicated to the control electronics and central processing unit 68. The pressure and tensile loading measurement may be used to control the movement of the thermode 41, or the measurement may be read out at the operator controls and read out unit 70. The result is that the die removal workstation 10 provides an automatic smart thermode 41 mode of operation. It provides precise touch-down sensitivity onto an integrated circuit device 60. It permits applying a precisely controllable amount of torque, pressure and tensile loading to an integrated circuit device 60. It permits stopping further movement after a thermode 41 touches down or after a device 60 breaks loose, and it permits reading out the amount of torque, pressure and tensile loading at the time the thermode 41 touches down or the device 60 breaks loose.

Automatic parts positioning is provided by coupling the x-axis drive motor 30 and the y-axis drive motor 32 to the control electronics and central processing unit 68. This permits the table 34 to be automatically positioned so that the defective integrated circuit device 60 which is to be removed is located directly beneath the thermode 41.

The table heater stage 36 located below the table 34 is coupled to the control electronics and central processing unit 68 for control thereby. The heater stage 36 is adapted to provide heat to the bottom of the hybrid microcircuit 35 to aid in loosening the defective integrated circuit device 60 that is to be removed by the thermode 41.

The thermocouple 51 that is located within the thermode 41 is coupled to the control electronics and central processing unit 68 in order to permit precise control of the temperature of the thermode 41. The strip heater 47 in the thermode 41 is coupled to the control electronics and central processing unit 68, as is a cooling control 67 also. The cooling control 67 controls the flow of a cooling fluid such as nitrogen gas through the thermode 41. By alternately actuating the strip heater 47 and the cooling control 67, the thermode 41 may be maintained at any desired temperature.

The operator controls and read out unit 70 includes buttons and dials that permit the operator to select different modes of operation such as a positioning mode, a touchdown mode, a die removal mode or a shear testing mode. Different speeds of operation of the variations motors may be selected, as well as different thresholds for torque and pressure and tensile loading parameters. Temperature controls set the temperature of the thermode 41 and of the heater stage 36 on the table 34. A joy stick may be provided for control of the x, y position of the table 34. Meters may be provided to read out temperature, torque and pressure and tensile loading. A printer may be provided to give a hard copy printout of the parameters, and a strip chart recorder may be provided to show the dynamic changes in the forces during die removal or during shear testing.

Typically, the touch down sensitivity is less than 40 grams. In regard to rotation, the thermode 41 can be controlled to within 0.009 degrees. This means that the die removal workstation 10 of the present invention is capable of working with large semiconductor integrated circuit devices 60 that are 0.580 inches square and are spaced 20 mils apart. The rate of rotation is controlled to 0.0063 degrees per second.

In operation, removing devices 60 vertically is accomplished by attaching the thermode 41 of the die removal workstation 10 to the device 60. A hybrid microcircuit 35 is fastened to the table 34 and the heater stage 36 is preheated to 150 degrees Celsius. Then an adhesive material such as a thermoset or a thermoplastic die attach material is applied to the tip of the thermode 41. Typically, Ablestick 41-1 thermosetting adhesive is used. The die removal workstation 10 is switched to touch down mode. The device 60 is positioned beneath the thermode 41, and the thermode 41 is started on its downward course. Initially, it moves at a high speed and switches to low speed as it approaches the device 60. The movement of the thermode 41 is stopped when the tip touches down on the semiconductor integrated circuit device 60 to be removed. Touch down is sensed by the pressure and tensile loading transducer 38. Touch down sensitivity is such that a positive pressure loading of less than 40 grams at the tip of the thermode 41 shuts off the first stepper motor 21. The thermode 41 is heated to 150 degrees Celsius and held in contact with the device 60 for six minutes to let the adhesive 62 cure. The thermode 41 is then heated to 250 degrees Celsius for 3 to 8 seconds to loosen the adhesive 63 holding the device 60 to the substrate 61. Finally, torque and tensile forces are applied simultaneously to break the device 60 loose. As soon as the device 60 breaks loose from the substrate 61, the workstation 10 stops applying torque and lifts the device 60 straight up. After the device 60 has been removed from the substrate 61 it is then removed from the thermode 41, and the thermode 41 is allowed to cool. Any residue of adhesive is removed from the tip of the thermode.

Thus, the automatic die removal workstation 10 removes damaged devices 60 vertically from a hybrid microcircuit 35 having delicate HDMI substrates 61 without interfering with closely-spaced neighboring devices 64. This is accomplished by simultaneously applying tensile and torsional forces. All forces are measured and controlled in real time. The workstation 10 of the present invention may also be used for shear testing flip chip die attach by applying a torsional force and identifying the arc angle to failure. The measured data may then be stored for quantitative and qualitative analysis.

The die removal workstation is very versatile and may be used for: device removal from high density multichip interconnect (HDMI) substrates, device removal from LTCC (low tensile co-fireable ceramic carrier packages), device removal of soldered components, flip chip attachment using solder, device removal from soldered outer lead bonded tab (tape automated bonding) devices, removal of large area substrates (up to 4×4 inches) attached with solder, removal of large area substrates (up to 4×4 inches) attached with thermoplastic adhesives, and measurement of tensile forces, torque or a combination thereof.

Thus there has been described a new and improved die removal apparatus and methods for use with flip chips that are attached to high density multichip interconnect hybrid packages. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. Apparatus for removing a semiconductor device from a substrate, said apparatus comprising:
   means for positioning and securing a substrate having a part to be removed;
   a thermode positionable along a vertical axis above said semiconductor device to be removed;
   a first drive means coupled to said thermode for selectively causing precise vertical movement thereof;
   a second drive means coupled to said thermode for selectively causing precise rotational movement thereof; and
   control means coupled to said first and second drive means for controlling the precise vertical movement and precision rotational movement of said thermode.

2. The apparatus of claim 1 further comprising means for measuring rotational movement applied to said thermode by said second drive means.

3. The apparatus of claim 2 further comprising means for measuring pressure and tensile loading applied to said thermode by said first drive means.

4. The apparatus of claim 1 in which said first and second drive means comprise gearhead stepper motors each having a shaft encoder.

5. The apparatus of claim 4 which further comprises precision alignment digital logic signal processing equipment for controlling said stepper motors.

6. The apparatus of claim 4 in which said means for positioning and securing a substrate having a semiconductor device to be removed comprises a table assembly having an x-y positioner and a heater stage adapted for heating the bottom of a substrate secured to said table assembly.

7. The apparatus of claim 6 in which said table assembly comprises drive means for automatically positioning the semiconductor device to be removed to a predetermined location.

8. The apparatus of claim 7 in which said thermode includes a strip heater and a thermocouple.

9. The apparatus of claim 8 in which said thermode includes a passage for a gaseous cooling medium.

10. The apparatus of claim 9 further comprising guide rails, a thermode carriage and a movable assembly, said thermode carriage being adapted to hold said thermode and being coupled to said movable assembly for vertical movement along said guide rails.

11. The apparatus of claim 10 further comprising a jack screw, said first drive means being coupled to said jack screw for moving said movable assembly vertically along said guide rails.

12. Die removal apparatus for removing an integrated circuit from a high density multilayer interconnect hybrid circuit, said apparatus comprising:
   a table assembly having an x-y positioner and heater stage and adapted for securing a high density multilayer interconnect hybrid circuit thereto, said hybrid circuit including an integrated circuit to be removed;
   a thermode carriage positionable along a vertical axis above said integrated circuit;
   a first stepper motor coupled to said thermode carriage for selectively causing precise vertical movement thereof;
   a second stepper motor coupled to said thermode carriage for selectively causing precise rotational movement thereof;
   a torque transducer coupled to said thermode carriage;
   a pressure and tensile loading transducer coupled to said thermode carriage;
   a thermode disposed in said thermode carriage and adapted to contact said integrated circuit disposed on the high density multilayer interconnect hybrid circuit;
   a control electronics and central processing unit coupled to the x-y positioner and heater stage of said table assembly and to said first and second stepper motors for controlling the application of pressure and torsion to the integrated circuit.

13. The die removal apparatus of claim 12 in which said thermode comprises a heater and a passage for a cooling fluid.

14. The die removal apparatus of claim 13 further comprising a movable assembly and a plurality of guide rails, said thermode carriage being mechanically coupled to said movable assembly for movement vertically along said guide rails.

15. The die removal apparatus of claim 14 in which said first stepper motor drives a jack screw that moves said movable assembly vertically along said guide rails.

* * * * *